(12) United States Patent
Thomason

(10) Patent No.: US 7,550,961 B2
(45) Date of Patent: *Jun. 23, 2009

(54) SYSTEMS AND METHODS FOR EVALUATING ELECTROMAGNETIC INTERFERENCE

(75) Inventor: Gary S. Thomason, Georgetown, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/809,026

(22) Filed: May 31, 2007

(65) Prior Publication Data

US 2007/0236207 A1    Oct. 11, 2007

Related U.S. Application Data

(63) Continuation of application No. 11/017,296, filed on Dec. 20, 2004, now Pat. No. 7,242,176.

(51) Int. Cl.
*G01R 31/00* (2006.01)
*G01R 27/28* (2006.01)

(52) U.S. Cl. .................. 324/96; 324/627; 324/628; 324/639; 324/501; 324/158.1

(58) Field of Classification Search .............. 324/96, 324/501, 627–629, 639
See application file for complete search history.

(56) References Cited

U.S. PATENT DOCUMENTS

| 5,043,659 | A |   | 8/1991  | Lowmiller et al. |
|-----------|---|---|---------|------------------|
| 5,153,524 | A | * | 10/1992 | McCormack ........ 324/627 |
| 5,311,116 | A |   | 5/1994  | Rogers |
| 5,414,366 | A | * | 5/1995  | Rogers ........ 324/627 |
| 5,514,971 | A |   | 5/1996  | Hankui et al. |
| 6,236,223 | B1|   | 5/2001  | Brady et al. |
| 6,242,925 | B1| * | 6/2001  | Schutten et al. ........ 324/627 |
| 6,255,830 | B1| * | 7/2001  | Rollin et al. ........ 324/627 |
| 6,509,742 | B1|   | 1/2003  | Ebizuka et al. |
| 6,606,064 | B1|   | 8/2003  | Lusterman |
| 6,617,860 | B2|   | 9/2003  | Uesaka et al. |
| 6,681,181 | B2|   | 1/2004  | Fielder |
| 6,752,320 | B1| * | 6/2004  | Herranen ........ 235/492 |
| 6,841,986 | B1|   | 1/2005  | Tannehill |
| 7,242,176 | B2| * | 7/2007  | Thomason ........ 324/96 |
| 2006/0132117 | A1|  | 6/2006  | Thomason |

FOREIGN PATENT DOCUMENTS

EP            0626586            8/2001

OTHER PUBLICATIONS

Johansson et al., "Theory Near-Field And Far-Field", Master Thesis Regulations Theory Measurements, http://www.sm.luth.se/~urban/master/Theory/3.html, printed from the Internet on Dec. 13, 2004, 9 pgs.
Agilent 54006A 6 GHz Passive Divider Probe Kit, Agilent Technologies, http:/we.home.agilent.com/cgi-bin/bvpub/agilent/Product/cp_Product.jsp?country_code=us&Nav_id=536885409.53...,  printed from the Internet on Nov. 29, 2004, 2 pgs.

* cited by examiner

*Primary Examiner*—Ha Tran T Nguyen
*Assistant Examiner*—Emily Y Chan
(74) *Attorney, Agent, or Firm*—O'Keefe, Egan, Peterman & Enders LLP

(57) ABSTRACT

Systems and methods for evaluating electromagnetic interference that may be employed, for among other things, to evaluate electronic system immunity to radiated electromagnetic fields and/or to identify particular electronic system areas that are susceptible to electromagnetic radiation.

22 Claims, 9 Drawing Sheets

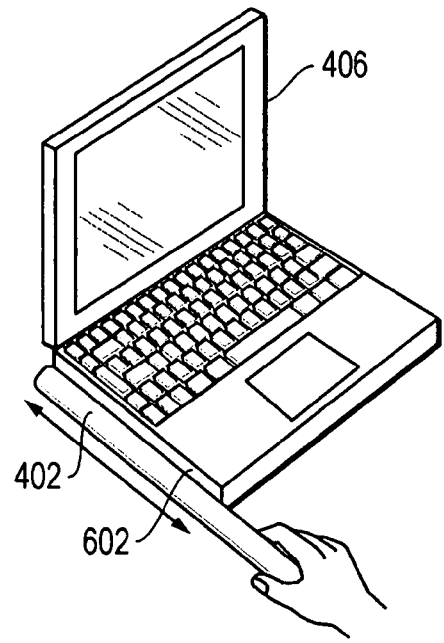 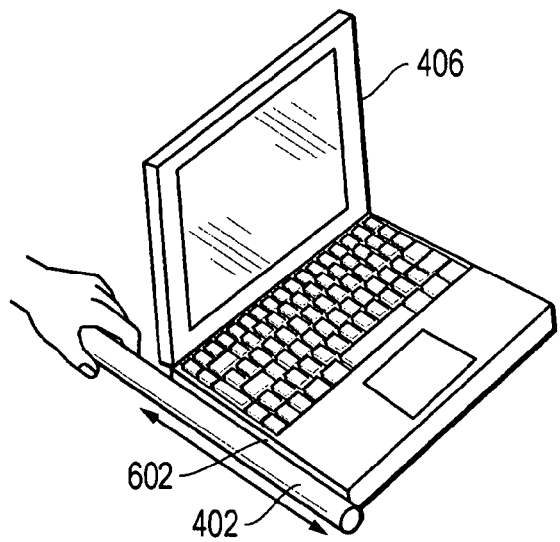
FIG. 6A        FIG. 6B
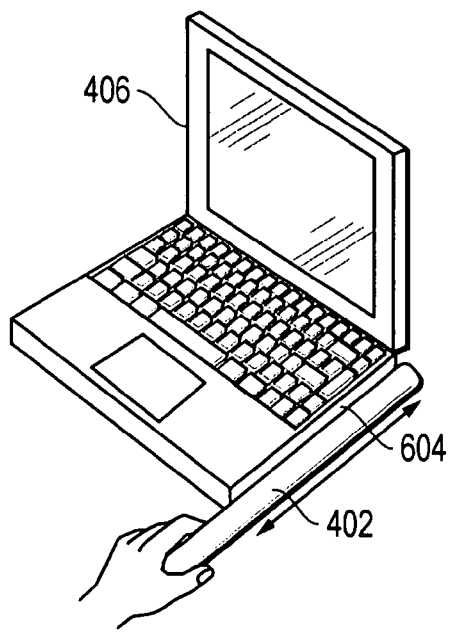 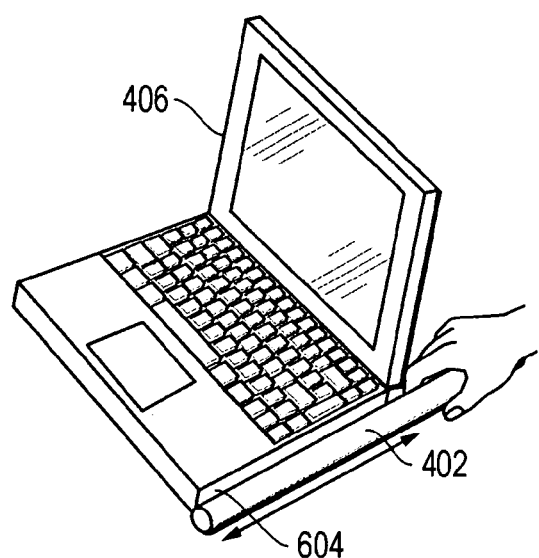
FIG. 6C        FIG. 6D

SYSTEMS AND METHODS FOR EVALUATING ELECTROMAGNETIC INTERFERENCE

This patent application is a continuation of U.S. patent application Ser. No. 11/017,296 entitled "Systems and Methods for Evaluating Electromagnetic Interference", filed Dec. 20, 2004, now U.S. Pat No. 7,242,176 which is incorporated herein by reference.

BACKGROUND OF THE INVENTION

1. Field of the Invention

This invention relates generally to electromagnetic interference, and more particularly to evaluating electromagnetic interference.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of portable information handling systems include portable notebook computers, and personal data assistants ("PDA's"). These portable devices continue to evolve with changing technology and to address the needs of users. Currently, it is not uncommon for functional issues (e.g., system malfunctions) to be experienced when a system (e.g., portable computer) is placed in close proximity to fields generated by wireless devices. Particular examples of such wireless devices that may induce system malfunctions include GSM PC Cards (which typically have an output of 1 to 2 Watts) and to a lesser extent, cellular phones.

In the past, one method for evaluating system immunity to GSM PC Cards has involved inserting a PCMCIA card (GSM PC Card) into a computer system and then exercising the card at discrete frequencies/settings. The antenna of the PC card is then manually oriented to try to induce a failure in the system (e.g., system locks up, audio buzz, video "blooming", etc.). However, such a method is limited by the possible range of antenna orientations, and it has been observed that the level transmitting from the PC Card antenna can fluctuate as much as 20 dB with slight movements in the antenna. This transmission level fluctuation has been observed in the laboratory and indicates that antenna connection to the PC card is not always reliable and thus makes the repeatability of this type of immunity test suspect. In addition, this past method for evaluating system immunity is basically a trial and error method in which the test is run, an antenna modification made, and then the test run again.

SUMMARY OF THE INVENTION

Disclosed herein are systems and methods for evaluating electromagnetic interference. The disclosed systems and methods may be implemented to, among other things, evaluate electronic system immunity to radiated electromagnetic fields and/or to identify particular electronic system areas that are susceptible to electromagnetic radiation.

In one embodiment, the disclosed systems and methods may be implemented to evaluate immunity of an electronic system (e.g., an information handling system) to radiated fields generated by a wireless device (e.g., GSM 850/900 and GSM 1800/1900 Cards and/or Cell Phones). This embodiment may be implemented, for example, using a "Wand Test" that may utilize a singular relatively small test wand antenna to create an electromagnetic field to match the frequency, field level, and modulation characteristics generated by the wireless device in question. In one embodiment, the transmitting power of a test antenna may be fixed based on the output power emitted from the wireless device in question (e.g., GSM PC card or other radio frequency source of concern). In one example of such a Wand Test, a test wand antenna (e.g., stub antenna that is tuned to the wavelength for the frequency band of concern) may be swept in close proximity to internal electronic components of the system from one or more sides of the system (e.g., front, back, top and bottom) while at the same time the system is monitored for any susceptibility to electromagnetic interference. Where the internal electronic components of the system are enclosed within an outer case or cover, a test wand may be swept in close proximity to internal electronic components of the system across one or more peripheral outer surfaces (e.g., front, back, top and bottom) of the electronics system, without the need for removing the outer cover. Whether or not an outer cover is in place, the wand antenna may be swept across each of one or more sides of the system in at least two substantially orthogonal directions.

In another embodiment, the disclosed systems and methods may be implemented to analyze electromagnetic interference issues at the board level, and to identify root causes of interference. For example, in one exemplary embodiment, a "Localized Field Probe Test" may be implemented to create a very localized electromagnetic field that will help identify areas of susceptibility, e.g., specific areas or components on a Printed Circuit Board ("PCB") that are susceptible to the frequencies of concern. The localized field probe test may be implemented in one example, using a short stub antenna.

In another exemplary embodiment, a "Direct Injection Field Probe Test" may be implemented to identify or pinpoint actual layout and component interference issues by injecting a relatively low level conducted radio frequency ("RF") signal onto board traces and component pins.

Various embodiments of the disclosed systems and methods may be implemented alone, or may be implemented in combination to achieve synergistic benefit. For example, a Wand Test may be first performed on an electronic system to identify an electromagnetic interference issue with the system. A Localized Field Probe Test may then be performed to identify specific areas or components of the system that are susceptible to the interference. A Direct Injection Field Probe Test may then be implemented to inject a low level conducted RF signal onto particular parts (e.g., board traces or component pins) of the interference areas identified by the preceding Localized Field Probe Test. However, it is also possible that any one of the disclosed Wand Test, Localized Field Probe Test, or Direct Injection Field Probed Test may be advantageously practiced alone or in any combination with one or both of the other remaining tests.

In one respect, disclosed herein is a method of evaluating electromagnetic interference with operation of an electronic device, including: producing a first electromagnetic transmit signal; supplying the first electromagnetic transmit signal to a test wand antenna to cause the test wand antenna to emit electromagnetic radiation; moving (e.g., sweeping) the test wand antenna in close proximity to one or more internal electronic components of the electronic device at the same time the test antenna is emitting the electromagnetic radiation; exercising the one or more electronic components of the electronic device while the electronic components are exposed to the near field of the electromagnetic radiation emitted by the test antenna; and monitoring the function of the one or more electronic components of the electronic device during the step of moving the test wand antenna in close proximity to the one or more internal electronic components.

In another respect, disclosed herein is a method of evaluating electromagnetic interference with operation of an electronic device, including: producing a first electromagnetic transmit signal; supplying the first electromagnetic transmit signal to a localized field probe to cause the localized field probe to emit a localized field of electromagnetic radiation; placing the localized field probe in close proximity to at least one electronic component of an electronic device at the same time the localized field probe is emitting the localized field of electromagnetic radiation; exercising the at least one electronic component of the electronic device while the at least one electronic component is exposed to the near field of the localized field of electromagnetic radiation emitted by the localized field probe; and monitoring a functionality of the electronic device while the at least one electronic component is exposed to the near field of the localized field of electromagnetic radiation emitted by the test antenna.

In another respect, disclosed herein is a method of evaluating electromagnetic interference with operation of an electronic device, including: producing a first electromagnetic transmit signal; supplying the first electromagnetic transmit signal to a direct injection field probe; contacting the direct injection field probe with at least one circuit of the electronic device to directly inject the first electromagnetic transmit signal into the at least one circuit of the electronic device; exercising the at least one circuit of the electronic device while directly injecting the first electromagnetic transmit signal into the at least one circuit of the electronic device; and monitoring a functionality of the electronic device while directly injecting the first electromagnetic transmit signal into the at least one circuit of the electronic device.

In another respect, disclosed herein is an electromagnetic interference test system, including: an electromagnetic signal source; and a test antenna, the test antenna including at least one of a test wand antenna, a localized field probe, or a direct injection field probe.

DESCRIPTION OF ILLUSTRATIVE EMBODIMENTS

Figure 1:
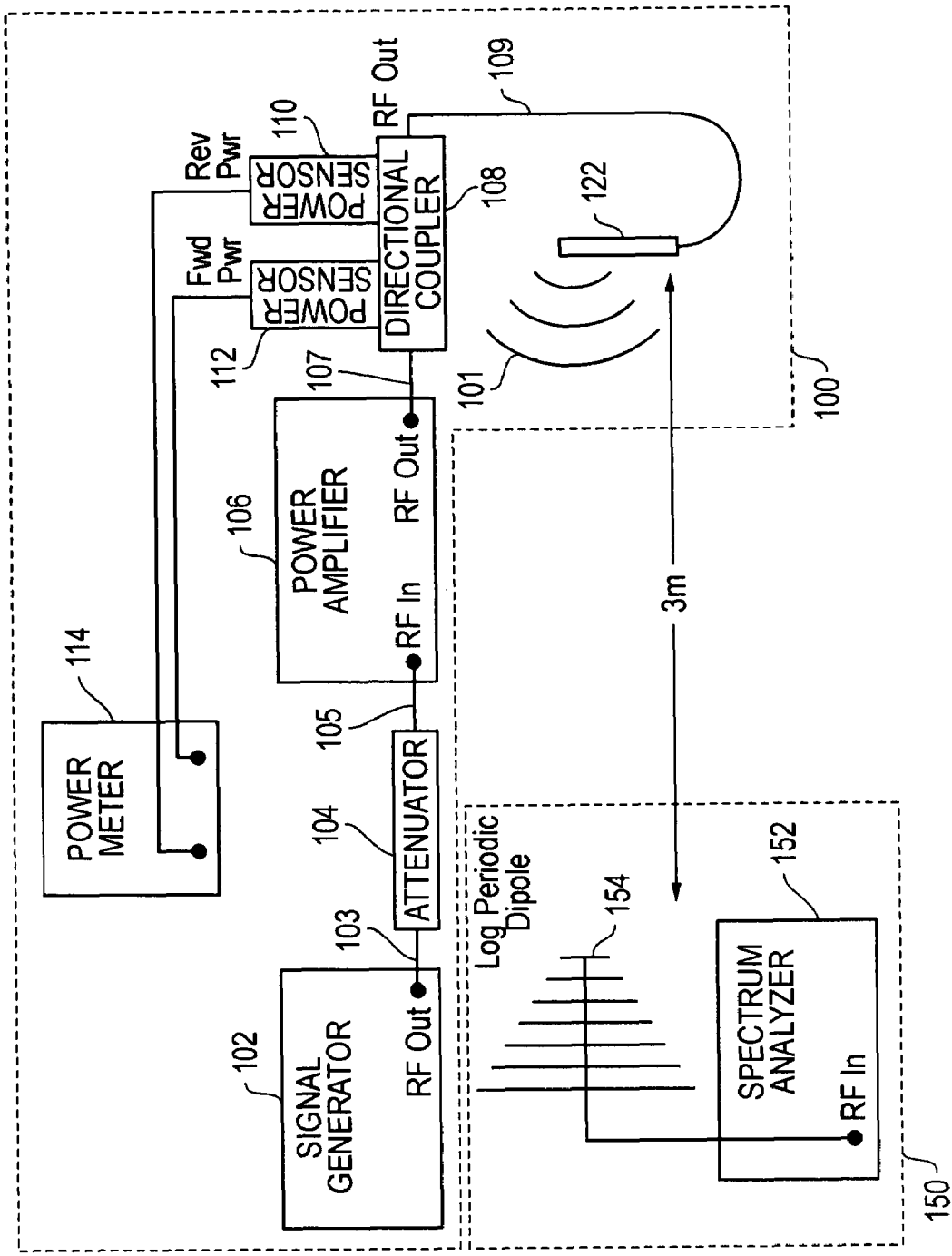
FIG. 1 is a block diagram of an electromagnetic interference test system according to one exemplary embodiment of the disclosed systems and methods.

FIG. 1 illustrates an electromagnetic interference test system 100 according to one exemplary embodiment of the disclosed systems and methods. Electromagnetic interference test system 100 may be utilized to generate electromagnetic radiation for use in evaluating electromagnetic interference in the manners as well be described further herein. As illustrated, electromagnetic interference test system 100 includes a test antenna 122 that is coupled to an electromagnetic signal source that includes electromagnetic signal generation components. In this exemplary embodiment, electromagnetic signal generation components include signal generator 102 (e.g. IFR 2032 signal generator [10 KHz-5.4 GHz]) for generating an RF signal 103 that is supplied to signal attenuator 104 (e.g., Hewlett Packard 8491A 10 dB attenuator). Signal attenuator 104 provides attenuated RF signal 105 to power amplifier 106 (e.g., Amplifier Research model 100W1000M1 100 Watt Power Amplifier [80-1000 MHz]). Power amplifier 106 supplies amplified RF signal 107 to directional coupler 108 (e.g., Amplifier Research Directional Coupler (40 dB), 0.01-1000 MHz). Directional coupler 108 supplies RF transmit signal 109 to test antenna 122 for generation of RF electromagnetic radiation 101. It will be understood that signal generation components of electromagnetic interference test system 100 are exemplary only, and that any other source of electromagnetic signals may be employed.

Various exemplary embodiments of test antenna 122 will be described further herein. However, it will be understood that a test antenna may have any configuration suitable for performing a Wand Test, Localized Field Probe Test, or Direct Injection Test in a manner as described further herein.

As illustrated in FIG. 1, power meter 114 (e.g., Boonton 4232A RF) may be coupled to directional coupled 108 via power sensors 110 and 112 for measuring respective reverse and forward power levels of RF transmit signal 109. It will be understood that the above-described specific components of electromagnetic interference test system 100 are exemplary only, and that any other types of individual components and/ or combinations thereof may be employed that are suitable for providing an RF transmit signal 109 to test antenna 122.

Also shown in FIG. 1 is optional electromagnetic radiation measurement system 150 that may be optionally implemented in one embodiment to measure and/or verify the characteristics (e.g., field level) of RF electromagnetic radiation 101 emitted by test antenna 122. As shown, electromagnetic radiation measurement system 150 includes a spectrum analyzer 152 (e.g., Hewlett Packard 8566B Spectrum Analyzer) coupled to log periodic dipole antenna 154. In the illustrated embodiment, log periodic dipole antenna 154 (e.g., Log Model #3146) is spaced from test antenna 122 by a distance of about 3 meters.

In the embodiment of FIG. 1, the distance between log periodic dipole antenna 154 (e.g., Log Model #3146) and test antenna 122 is selected to be a distance within the far field for the frequencies of concern (greater than or equal to about 150 MHz for this embodiment). Further information on near and far fields may be found in *EMC of Telecommunication Lines*, A Master Thesis from the Fieldbusters 201 1997: Joachim Johansson and Urban Lundgren, http://www.sm.luth.se/~urban/master/Theory/3.html, which is incorporated herein by reference.

In one exemplary embodiment of the disclosed systems and methods, the following procedure may be employed in preparation for performing an electromagnetic test on an electronic system platform, such as an information handling system (e.g., notebook computer, PDA, etc.). This procedure may be performed to verify that electromagnetic interference test system 100 produces electromagnetic radiation 109 having characteristics that duplicates the characteristics of an interference source, such as a GSM PC Card or any other type of electromagnetic interference (e.g., GSM/GPRS/1XRTT PC Cards, Cell phone, wireless local area network—WLAN, wireless wide area network—WWAN, Hand Held Walkie Talkie, etc.). The electronic system platform to be tested is referred to herein as the equipment under test ("EUT").

In this procedure, signal generator 102 is first set to deliver an RF signal 103 having the same frequency and modulation characteristics recorded in a system platform field measurement of the EUT. In one exemplary embodiment, procedure of such a system platform field measurement may include, for example, configuring a platform system with a GSM/GPRS card setup to transmit at the desired frequency and power level. The GSM/GPRS card antenna is oriented to produce the maximum level on measuring device used to calibrate the field. The carrier frequency, modulation characteristics are verified and the maximum level is recorded. The platform system is then replaced with the Wireless Wand antenna.

The spectrum analyzer 152 is also set to display the required field levels recorded in the system platform field measurement. The output level of the signal generator 102 is then adjusted until the field level of electromagnetic radiation 101 measured by spectrum analyzer 152 of electromagnetic radiation measurement system 150 matches the power level recorded during the system platform field level measurement (e.g., from about 1 to 2 watts for a GSM PC Card). The frequency and modulation characteristics of electromagnetic radiation 101 measured by spectrum analyzer 152 are also compared to the frequency and modulation characteristics recorded in the system platform field measurement to verify that these values are the same. Any necessary adjustments to frequency and modulation characteristics of RF signal 103 may be made. Then, both forward and reverse power levels measured by power meter 114 are recorded. These recorded values are recorded for use during testing of the EUT to verify that the correct signal power level is employed.

It will be understood that the particular illustrated configuration of electromagnetic interference test system 100 is exemplary only, and that any other suitable configuration of components suitable for generating and supplying an electromagnetic transmit signal of desired power, frequency and/or modulation characteristics to a test antenna may be alternatively employed. Furthermore, it will be understood that the particular illustrated configuration of electromagnetic radiation measurement system 150 is also exemplary only, and that any other suitable configuration for measuring and/or verifying the characteristics of electromagnetic radiation may be employed.

Figure 2:
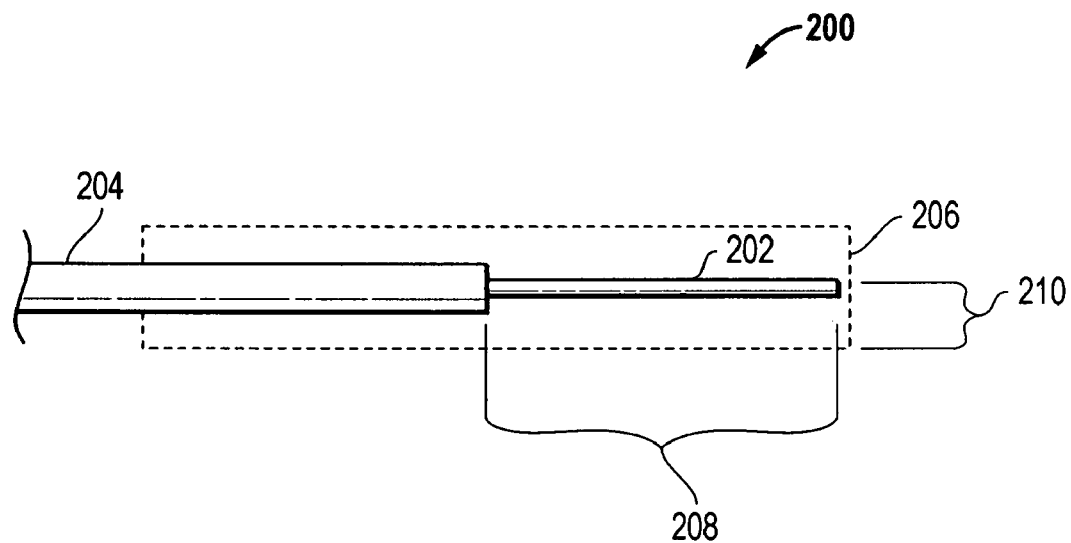
FIG. 2 is a cross sectional view of a test antenna according to one exemplary embodiment of the disclosed systems and methods.

FIG. 2 illustrates one embodiment of a test antenna 200 as it may be configured for use in wand testing of an EUT. In the illustrated embodiment test antenna 200 is a stub antenna including a conductive antenna stub 202 extending from a dielectric sheath 204. Antenna stub 202 may be of any length suitable for transmitting electromagnetic radiation, but in one exemplary embodiment may be tuned to the wavelength for the frequency band of concern. In this regard, antenna stub 202 may have a length that is a divider or multiple of the wavelength. For example, in the case of GSM band 850/900 and 1800/1900 bands, the length 208 of antenna stub 202 may be been set to be about 8.4 centimeters, which closely matches the ¼ and ½ wavelengths of these bands, respectively. In one exemplary embodiment, antenna stub 202 may be created by stripping back the outer shield portion of a semi-rigid coaxial cable (e.g., RG402/U or other suitable type of cable) and leaving a copper or aluminum conductive stub having length 208 as defined above. Antenna stub 202 may be coupled in any suitable manner to receive an electromagnetic signal (e.g. RF transmit signal 109 of FIG. 1) for transmission.

As further shown in FIG. 2, test antenna 200 may also include a dielectric spacer 206 that is placed around or surrounds antenna stub 202 to maintain a consistent dielectric spacing between antenna stub 202 and the EUT during a Wand Test. Dielectric spacer 206 may be of any shape (e.g., cylindrical-shaped, bar-shaped, irregular-shaped etc.) and outer dimension suitable for creating a desired dielectric spacing 210 between antenna stub 202 and the EUT, but in one exemplary embodiment may be a wooden cylinder of about ¾ inch diameter (e.g., hollow broom stick) that creates a dielectric spacing 210 of about ⅜ inch. Besides wood, other suitable dielectric materials include any material (e.g. nylon, polyethylene, polypropylene, PVC, other plastics, etc.) having a relative permittivity equal to about 1. In one embodiment, a dielectric spacer may be selected with dimensions that allow a wand antenna to be swept at a distance from electronic components of an electronic system that is substantially equivalent to the distance that a wireless card or other potentially interfering wireless device will be operatively disposed from these electronic components during operation. A dielectric spacer may also be provided to maintain a consistent spacing for tests of different electronic systems.

Figure 3:
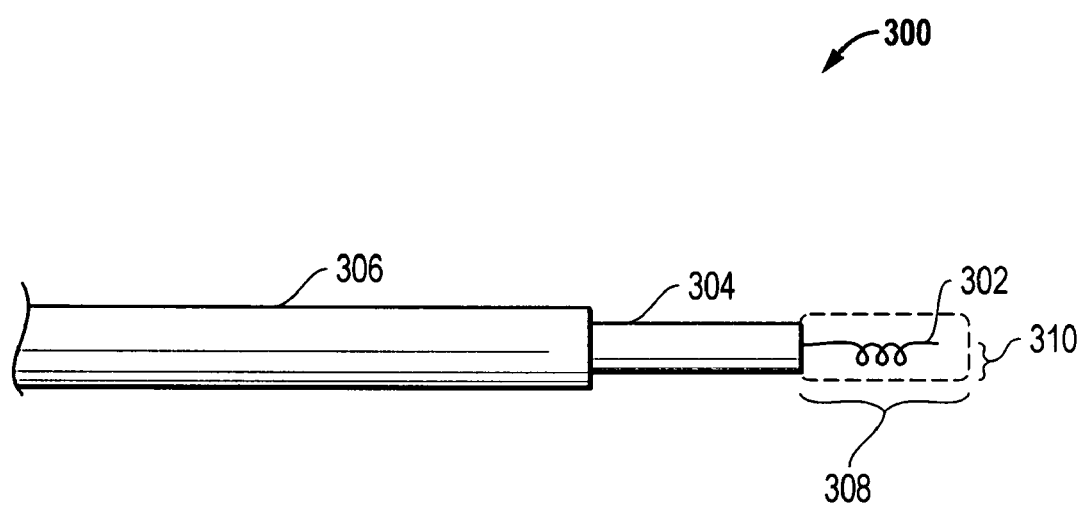
FIG. 3 is a cross sectional view of a test antenna according to one exemplary embodiment of the disclosed systems and methods.

FIG. 3 illustrates another embodiment of test antenna configured as a localized field probe 300 that includes a conductive antenna stub 302 extending from a dielectric sheath 304. Antenna stub 302 may be of any length suitable for transmitting electromagnetic radiation, but in one exemplary embodiment may be helical in configuration to render it more compact in size for localized field probing (e.g., for emitting a localized field of electromagnetic radiation suitable for exposing a first electronic component to a near field of the localized field without exposing an adjacent component to the near field of electromagnetic radiation so as to allow component by component probing without affecting adjacent components) as described further herein, and may be tuned to the wavelength for the frequency band of concern. For example, helical antenna stub may have an unwound length that is a divider or multiple of the electromagnetic radiation wavelength. In the case of GSM band 850/900 and 1800/1900 bands, the length 308 of antenna stub 302 may be set to about 2 centimeters, which closely matches the ⅛ and ¹⁄₁₆ wavelengths of these bands, respectively, and may be wound in a helical spiral of two turns. In one exemplary embodiment, antenna stub 302 may be created by stripping back the outer shield portion of a semi-rigid coaxial cable (e.g., RG402/U or other suitable type of cable) and leaving a copper or aluminum conductive stub having length 308 as defined above. Antenna stub 302 may be coupled in any suitable manner to receive an electromagnetic signal (e.g. RF transmit signal 109 of FIG. 1) for transmission.

As further shown in FIG. 3, test antenna 300 may also include a dielectric spacer 306 that is placed around or surrounds antenna stub 302 to maintain dielectric spacing between antenna stub 302 and components of the EUT (e.g. to prevent electrical shorting) during a Localized Field Probe Test. Dielectric spacer 206 may be of any shape (e.g., cylindrical-shaped, bar-shaped, irregular-shaped, etc.) and outer dimension suitable for creating a desired dielectric spacing 310 between antenna stub 302 and components of the EUT, but in one exemplary embodiment may be a layer of silicone caulking material that creates a dielectric spacing 310 of about ¹⁄₁₆ inch. Besides silicon, other suitable dielectric materials include any material (e.g. nylon, polyethylene, polypropylene, PVC, other plastics, etc.) having a relative permittivity of equal to about 1.

Wand Test

In one embodiment, the disclosed systems and methods may be implemented to evaluate immunity of an electronic system (e.g., information handling system) to radiated fields generated by an electromagnetic radiation source, such as a wireless device (e.g., GSM 850/900 and GSM 1800/1900 Cards, Cell Phones, etc.). This embodiment may be implemented using a suitable test antenna (e.g., such as test antenna 200 of FIG. 2) coupled to a suitable electromagnetic signal source (e.g., electromagnetic interference test system 100 of FIG. 1) to create an electromagnetic field to match the frequency, field level, and modulation characteristics generated by the wireless device in question. During a wand test, forward power of RF transmit signal may be set as needed or desired to fit a given test application (e.g., as determined from product technical specifications and/or empirical data taken in the lab). For example, during a wand test performed to simulate radiated electromagnetic field of a wireless device transmitting in the GSM 850/900 bands, the forward power may be set to 2 Watts for a 2-Watt test. For a wand test performed to simulate radiated electromagnetic field of a wireless device transmitting in the GSM 1800/1900 bands, the forward power may be set to 1-Watt for a 1-Watt test.

In one exemplary embodiment of Wand Test, the test antenna may be swept in close proximity to electronic components of the system from one or more sides of the system while at the same time the system is monitored for any susceptibility to electromagnetic interference. During each sweep, the test antenna may be held in close proximity to each side of the electronics system, meaning that the antenna is held in a position such that the electronic components (e.g., electronic circuits, combinations of electronic circuits, etc.) of the electronics system are within the near field of the electromagnetic radiation emitted by the antenna at the frequency of concern. Although not necessary, the test antenna may be swept across each of one or more selected sides of the system in at least two substantially orthogonal directions to create two orthogonal and opposite fields. In one exemplary embodiment, a Wand Test may be performed under the following test conditions: ambient temperature of from about 15° C. to about 35° C., minimum relative humidity of from about 30% to about 60%, atmospheric pressure of from about 68 kPa (680 mbar) to about 106 kPa (1060 mbar), although a Wand Test may be performed under other conditions.

In one exemplary embodiment, a Wand Test may be performed on a EUT using a test procedure in which various electronic components, (e.g., audio, video and/or processing circuits) of the EUT may be exercised during the Wand Test in order to evaluate functionality of these features during exposure to electromagnetic radiation. For example, during Wand Testing of a notebook computer, the EUT may be set up on top of a horizontal plane (e.g., wooden table). During the test, audio files may be played from the CD ROM drive or hard drive, video may be displayed from the DVD drive or other source, data may be retrieved and written to a floppy drive or other storage device, etc. These audio, video and/or processing circuits may be monitored for malfunction as the test antenna is swept across one or more peripheral surfaces of the system.

In one exemplary embodiment employing electromagnetic interference test system 100, a GSM 900 MHz 2 Watt Wand Test may begin with activation of signal generator 102 to a first frequency (e.g.,. 870.13 MHz) of several desired frequencies for to be tested, and the RF level of signal generator 102 set as desired. One example of a multiple frequency set for testing a notebook computer includes the following frequencies: 870.13 MHz, 880.13 MHz, 885.13 MHz, 889.8 MHz, 902.33 MHz, and 914.72 MHz to be tested in that order. Next, power amplifier 106 may be activated at maximum gain and the correct RF power level (e.g., 2 Watts) verified using power meter 114, making any necessary adjustment to signal generator 102 for power loss in directional coupler 108. The test antenna 122 may then be held manually at the connector end (e.g., the end where test antenna 122 is connected via wire to directional coupler 108) and swept slowly across one or more peripheral surfaces of the EUT in a manner as further described and illustrated herein. During the test procedure, it may be desirable to keep hands away from the field area of test antenna 122 to optimize results. During the test, the EUT is checked for functionality (e.g., monitored for system shutdown, audio buzz from speakers, touchpad functionality, presence of anomalies, etc.) After all sweeps at the given frequency are complete, the test may be repeated for each remaining frequency, i.e., when multiple frequencies are to be tested. After testing the battery of the notebook computer may be tested for functionality by removing power and letting the EUT run for at least 10 minutes. Power may then be returned to the EUT to check for normal battery charge operation. It will be understood that similar testing procedure may be employed for other types of EUTs.

FIGS. 4-7 illustrate performance of a Wand Test on the base component of a notebook computer 406 using a test antenna 402 (e.g., such as test antenna 200 of FIG. 2 or other suitable electromagnetic radiation emitting antenna configuration) that is coupled to a suitable electromagnetic signal source (e.g., electromagnetic interference test system 100 of FIG. 1). Notebook computer 406 is shown having an outer cover in place, although similarly test methodology may be performed with part or all of the outer cover surfaces removed.

In FIGS. 4-7, test antenna 402 is shown being swept in close proximity to internal electronic components of computer 406 across various peripheral surfaces of the base component of notebook computer 406 while at the same time the notebook computer 406 is monitored for any susceptibility to electromagnetic interference (e.g., monitored for failures such as system lock up, audio buzz, video artifacts or "blooming", etc.). Although not shown, the peripheral surfaces of the lid/display component (e.g.,. LCD panel) of notebook computer 406 may be swept in similar fashion. In FIG. 4-7, the peripheral surfaces of the notebook computer are the outer cover surfaces of the notebook computer case. As mentioned above, a similar methodology may be used to peripherally sweep an EUT that has one or more portions of its case removed.

Figure 4C:
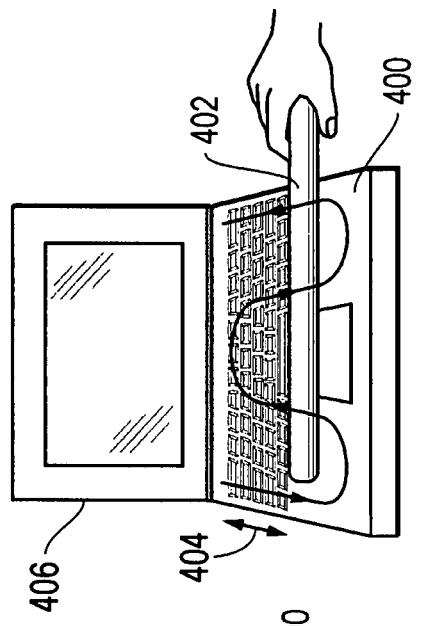
FIG. 4 illustrates a Wand Test according to one exemplary embodiment of the disclosed systems and methods.
Figure 4B:
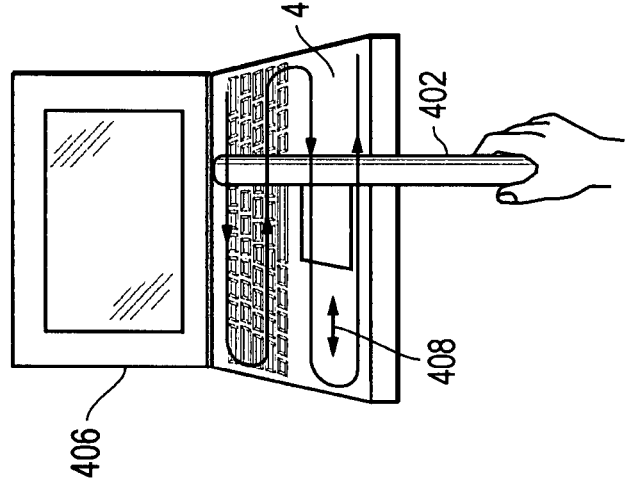
Figure 4A:
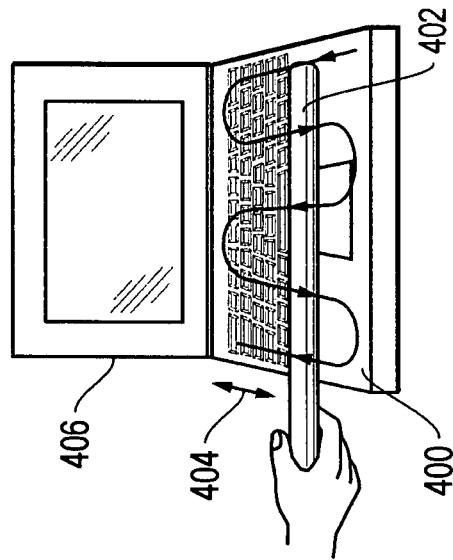
Figure 5A:
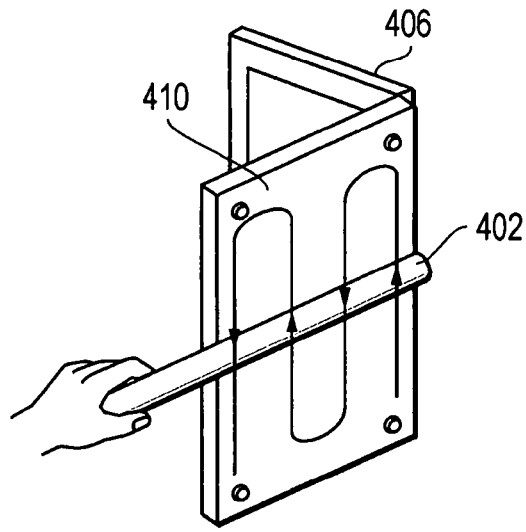
FIG. 5 illustrates a Wand Test according to one exemplary embodiment of the disclosed systems and methods.
Figure 5B:
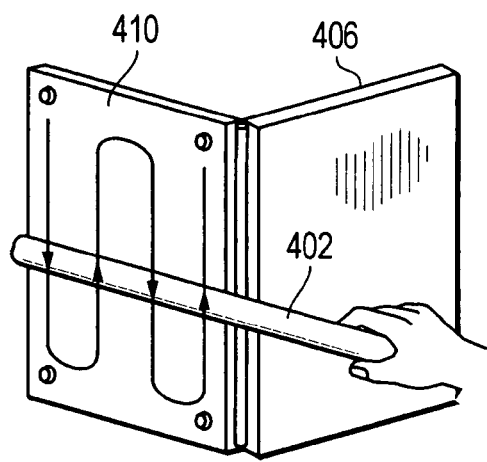
Figure 5C:
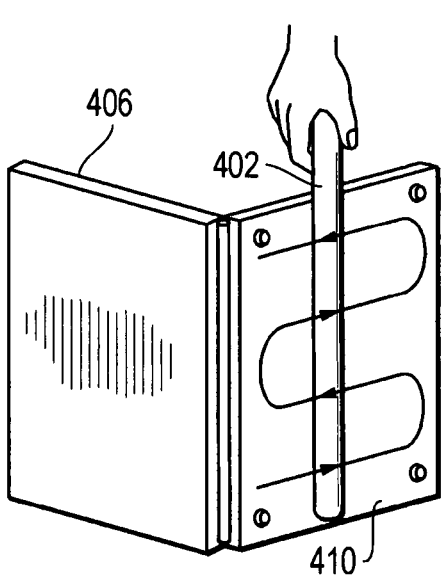
Figure 5D:
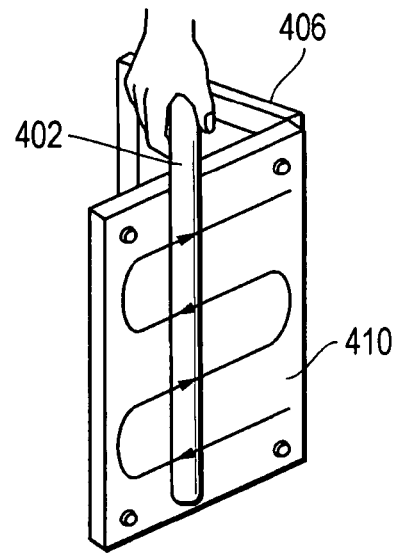
Figure 6E:
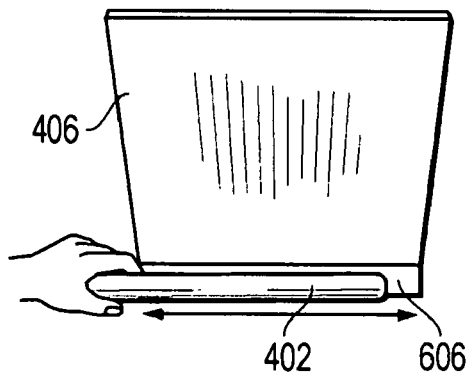
FIG. 6 illustrates a Wand Test according to one exemplary embodiment of the disclosed systems and methods.
Figure 6F:
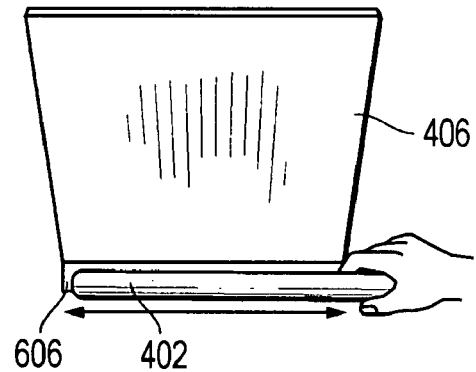
Figure 6G:
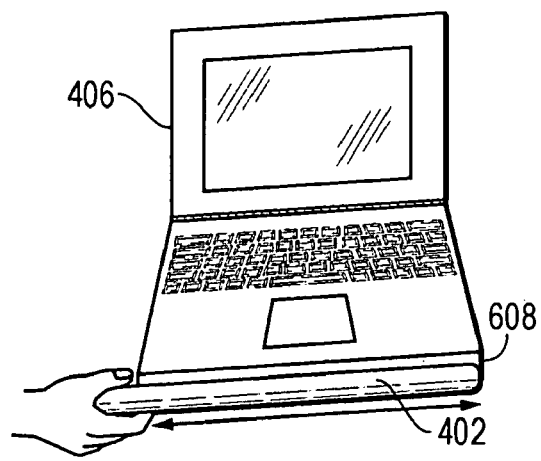
Figure 6H:
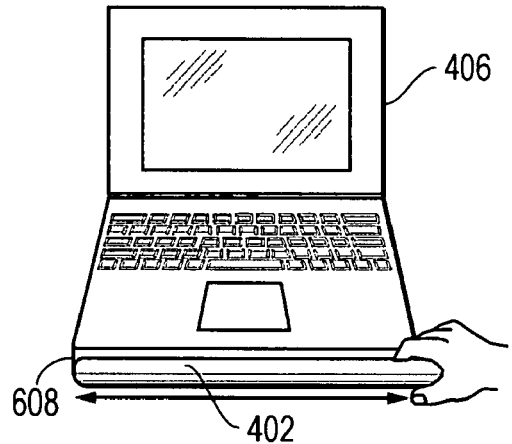
Figure 7A:
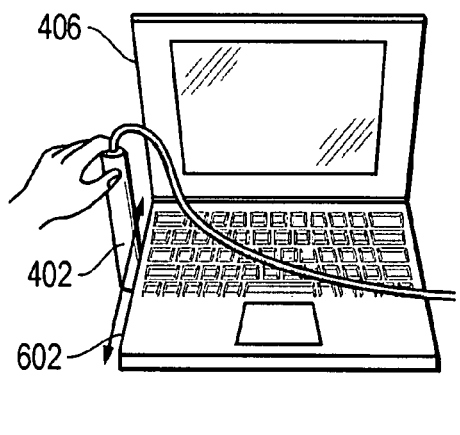
FIG. 7 illustrates a Wand Test according to one exemplary embodiment of the disclosed systems and methods.
Figure 7B:
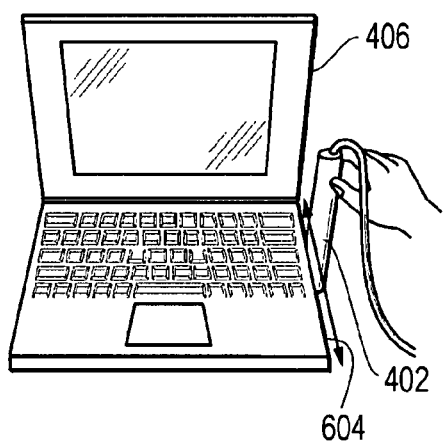
Figure 7C:
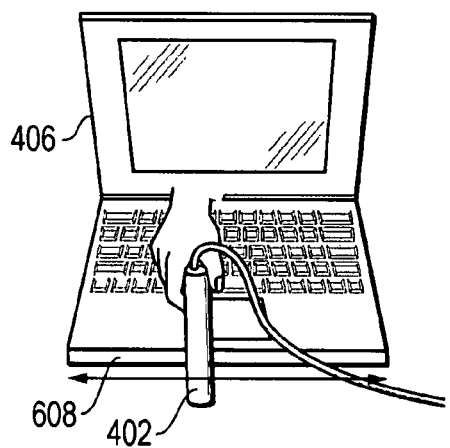
Figure 7D:
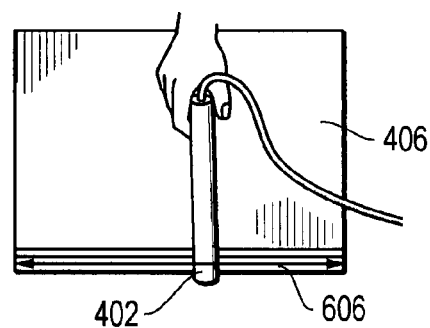

FIG. 4 shows notebook computer 406 placed in upright position with palmrest and keyboard surface 400 being successively swept in close proximity by test antenna 402 in substantially orthogonal directions 404 and 408. As illustrated by the sweep pattern arrows of FIG. 4, test antenna 402 may be held in various orientations (e.g., from each side and from the front of notebook computer 406), while being swept back and forth in an offset reciprocating or serpentine pattern across surface 400 so that the electromagnetic radiation pattern of the antenna (e.g., created by antenna stub 202 of test antenna 200) is swept across all internal electronic components underlying surface 400 of notebook computer 406. In this regard, each reciprocating pass of the antenna may be made such that the emitted electromagnetic radiation pattern overlaps a preceding adjacent pass of the antenna.

FIG. 5 shows notebook computer 406 placed on its side and illustrates test antenna 402 being swept back and forth in an offset reciprocating or serpentine pattern across underside surface 410 of notebook computer 406. FIG. 6 shows notebook computer 406 placed in upright position and illustrates test antenna 402 being swept in a back and forth motion pattern across each of side surfaces 602, 604, 606 and 608 of notebook computer 406. As shown in FIG. 6, test antenna 402 is swept across each of side surfaces 602, 604, 606 and 608 from two different orientations in which test antenna 402 is held substantially parallel to the given side surface. FIG. 7 shows notebook computer 406 placed in upright position and illustrates test antenna 402 being swept in a back and forth motion pattern across each of side surfaces 602, 604, 606 and 608 of notebook computer 406. As shown in FIG. 7, test antenna 402 is swept across each of side surfaces 602, 604, 606 and 608 while test antenna 402 is held from above and substantially perpendicular to the given side surface.

It will be understood that FIGS. 4-7 are exemplary only, and that other sweep pattern/s may be employed on notebook computer 406 and/or other types of electronic devices (e.g., PDA's, desktop computers, etc.) to evaluate electromagnetic interference and system immunity to same. Examples of other such sweep pattern/s include circular, spiral, linear, or any other sweep pattern/s that at least partially exposes electronic components of the EUT to electromagnetic radiation emitted by a test antenna 406. Furthermore, it will be understood that such sweep patterns may be performed manually as illustrated (e.g., by hand) or in automated fashion (e.g., using robotics or other mechanical sweeping apparatus).

Localized Field Probe Test

The disclosed systems and methods may be implemented in another embodiment to create a very localized electromagnetic field that will help identify areas of susceptibility of an electronic system (e.g., information handling system) to radiated fields generated by an electromagnetic radiation source, such as a wireless device (e.g., GSM 850/900 and GSM 1800/1900 Cards, Cell Phones, etc.). Such areas of susceptibility may include, for example, specific areas or components (e.g., integrated circuits, computer chips, circuit traces, etc.) on a Printed Circuit Board ("PCB") that are susceptible to the frequencies of concern. Such a Localized Field Probe Test may be performed as a stand-alone test, but in one exemplary embodiment may be advantageously implemented after a Wand Test in which functionality of an EUT has been found to be affected by one or more electromagnetic frequencies. In such a case, the Localized Field Probe Test may be used to further pinpoint specific areas or components of the EUT that are susceptible to the electromagnetic frequencies of concern.

A Localized Field Probe Test may be implemented using a suitable test antenna (e.g., such as localized field probe 300 of FIG. 3) coupled to a suitable electromagnetic signal source (e.g., electromagnetic interference test system 100 of FIG. 1) to create an electromagnetic field to match the frequency, field level, and modulation characteristics generated by the wireless device in question. During a Localized Field Probe Test, forward power of RF transmit signal may be set as needed or desired to fit a given test application (e.g., as determined by empirical data taken in the lab). For example, during a localized field probe test performed to simulate radiated electromagnetic field of a wireless device, the forward power may be set to a relatively higher power level than used in a corresponding Wand Test performed on the same EUT at the same frequency. Such a higher power level may be needed for the localized field probe test when a relatively short antenna stub (e.g., such as helical antenna stub 302 of test antenna 300) is employed in order to generate sufficient interference to replicate known susceptibility issues. Such known susceptibility issues may be determined by a preceding Wand Test, and a suitable localized field probe test power level may be determined, for example, empirically in a lab. For example, empirical data obtained in the Lab has indicated that 5 Watts of forward transmit power applied to a localized field probe (e.g., such as localized field probe 300 of FIG. 3) matches well the field levels measured from a GSM card of a notebook computer, and is felt to be a good measure for emulating the fields seen in close proximity (i.e., within the near field) of a GSM card.

In one exemplary embodiment of Localized Field Probe Test, the test antenna may be placed in close proximity (e.g., within the near field of the electromagnetic radiation emitted by the antenna at the frequency of concern) to one or more electronic components of an EUT in order to test these one or more components. For a notebook computer, these may be the internal printed circuit board (PCB) and/or attached electronic devices of the computer. Although it is possible that all electronic components of an EUT may be tested by the localized field probe, it may be advantageous to only test those components related to a susceptible function identified by previous wand test as being susceptible to electromagnetic interference, or that have been identified by any other method.

During a Localized Field Probe Test, one or more electronic components of an EUT may be tested by a localized field probe while at the same time the system is monitored for any susceptibility to electromagnetic interference. In this regard, a Localized Field Probe Test may be performed on a EUT using a test procedure in which various electronic components, (e.g., audio, video and/or processing circuits) of the EUT may be exercised during the Localized Field Probe Test in order to evaluate functionality of these features during exposure to electromagnetic radiation. These audio, video and/or processing circuits may be monitored for malfunction as the localized field probe is placed in close proximity to one or more electronic components of the system.

Figure 8:
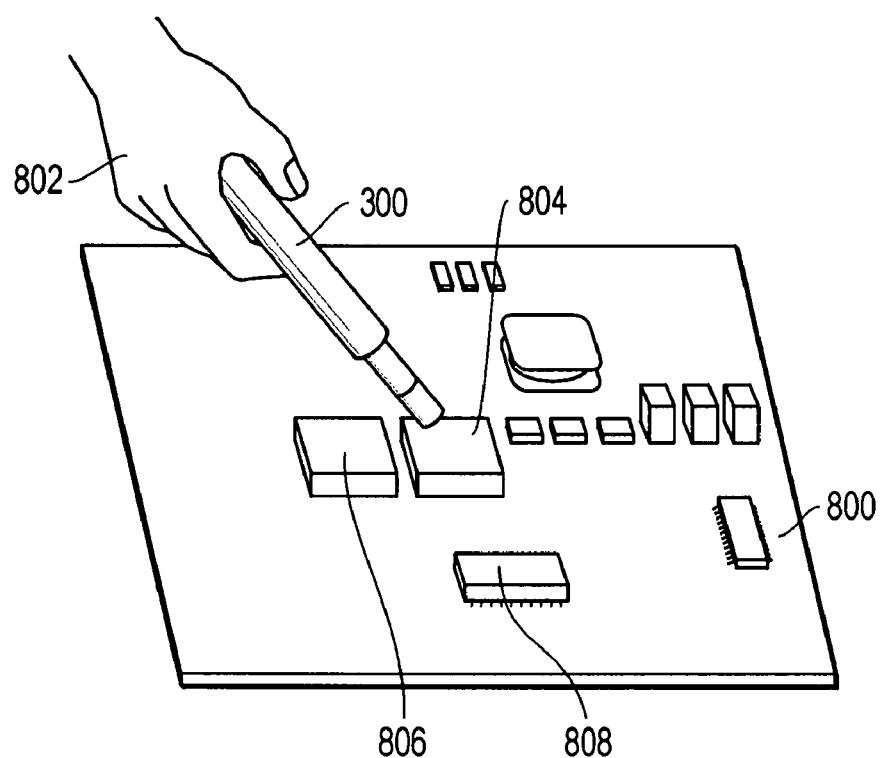
FIG. 8 illustrates a Localized Field Probe Test according to one exemplary embodiment of the disclosed systems and methods.

FIG. 8 illustrates one exemplary embodiment of a method in which localized field probe 300 of FIG. 3 may be placed in close proximity to each of components 804, 806 and 808 of printed circuit board 800 of notebook computer 406 of FIGS.

4-7, although it will be understood that any other suitable configuration of localized field probe may be employed in other embodiments. Specifically, FIG. 8 illustrates localized field probe 300 placed in close proximity to electronic component 804 such that only component 804 is exposed to the near field of electromagnetic radiation emitted by localized field probe 300. Although not shown, localized field probe 300 may be similarly placed in close proximity to each of components 806 and 808 in one at a time fashion.

As shown in FIG. 8, printed circuit board 800 includes various electronic device and circuit trace components. However, for purposes of this example, it is assumed that electronic components 804, 806 and 808 are the only components corresponding to a particular area of electromagnetic susceptibility identified during wand testing described and illustrated in relation to FIGS. 4-7. Thus, in this embodiment, localized field probe 300 is only placed in close proximity to electronic components 804, 806 and 808, and only at those particular one or more frequencies of concern identified in the previous wand test. Such a localized field probe test may be carried out to test the indicated electronic components at the indicated frequencies and power using a procedure similar to that described above for wand testing. Although localized probe 300 is shown being held by human hand 802, it will be understood that automated placement of a localized field probe is also possible, e.g., using robotics or other mechanical placement apparatus.

Direct Injection Probe Test

The disclosed systems and methods may be implemented in another embodiment as a Direct Injection Probe Test to identify or pinpoint actual layout and component interference and failure issues by injecting a low level conducted RF signal onto particular circuits (e.g., board traces and/or component pins) of an electronic system (e.g., information handling system). As with a Wand Test and Localized Field Probe Test, characteristics of such a conducted RF signal may be selected to correspond to radiated fields generated by an electromagnetic radiation source, such as a wireless device (e.g., GSM 850/900 and GSM 1800/1900 Cards, Cell Phones, etc.). Such a Direct Injection Probe Test may be performed as a stand-alone test, but in one exemplary embodiment may be advantageously implemented following a Localized Field Probe Test to inject a conducted RF signal onto particular circuits of specific areas of susceptibility (e.g., integrated circuits, computer chips, circuit traces, etc.) found to be susceptible to one or more electromagnetic frequencies in the preceding Localized Field Probe Test. A specific example of a specific area of susceptibility would be a DC/DC controller that is identified as a failure component causing shut down of a notebook computer at 900 MHz.

Portion A Direct Injection Probe Test may be implemented using any test antenna configuration suitable for injecting a low level conducted RF signal onto particular circuits. For example, in one exemplary embodiment, a resistive divider probe may be employed as a direct injection field probe. One example of a suitable resistive divider probe is an Agilent 54006A Resistive Divider Probe with a 950 ohm resistor and an Agilent 11742A blocking cap. Other examples of suitable types of direct injection field probes include, but are not limited to, Cascade Microtech FPR-Series Resistive Divider Probes, Agilent 10020A Resistive Divider Probe Kit, etc. It will be understood that these are exemplary only and that any other suitable probe configuration may be employed, e.g., such as any hand made probe that includes a 50 ohm coaxial cable, series resistance, and DC blocking capacitor.

During a Direct Injection Probe Test, a direct injection field probe may be coupled to a suitable electromagnetic signal source (e.g., electromagnetic interference test system 100 of FIG. 1) to create an electromagnetic field to match the frequency, field level, and modulation characteristics generated by the wireless device in question. During a Direct Injection Probe Test, forward power of RF transmit signal may be set as needed or desired to fit a given test application (e.g., as determined by empirical data taken in the lab). For example, during a localized field probe test performed to simulate radiated electromagnetic field of a wireless device, the forward power may be set to a relatively lower power level than used in corresponding Wand Test and Localized Field Probe Tests performed on the same EUT at the same frequency. Such a lower power level may be employed due to the fact that the RF signal is being conductively injected into the circuit/s in question, and may be selected to be of sufficient power to generate interference to replicate known susceptibility issues. Such known susceptibility issues may be those determined by preceding Wand Test and/or Localized Field Probe Test, and a suitable localized field probe test power level may be determined, for example, empirically in a lab. For example, empirical data obtained in the Lab has indicated that about 5 mWatts (7.0 dBm) of forward power may be used to generate an output of about 100 mV at the Direct Injection Field probe tip of the an Agilent 54006A Resistive Divider Probe described above. In one embodiment power levels in this range (from about 70 mV to about 100 mV into 50 ohm load) have been demonstrated as an effective level for identifying failures at the component level for an EUT that is a notebook computer previously described.

In one exemplary embodiment of Direct Injection Probe Test, the Direct Injection Field probe tip may be contacted or otherwise conductively coupled to one or more particular circuits of an EUT, such as a notebook computer. Although it is possible that one or more circuits of an EUT may be randomly contacted with the Direct Injection Field probe tip to identify interference issues, it may be particularly advantageous to contact and test only those circuits of problem components identified by a preceding Localized Field Probe Test and/or problem areas identified by a previous Wand Test, or such circuits and/or areas that have been identified by other method.

During a Direct Injection Probe Test, an RF test signal may be injected into one or more circuits of an EUT while at the same time the system is monitored for any susceptibility to electromagnetic interference. In this regard, a Direct Injection Probe Test may be performed on a EUT using a test procedure in which various electronic components, (e.g., audio, video and/or processing circuits) of the EUT may be exercised during the Direct Injection Probe Test in order to evaluate functionality of these features during exposure to electromagnetic radiation. These audio, video and/or processing circuits may be monitored for malfunction as the Direct Injection Probe Test is used to inject the RF test signal into one or more circuits of the electronic components of the system.

Figure 9:
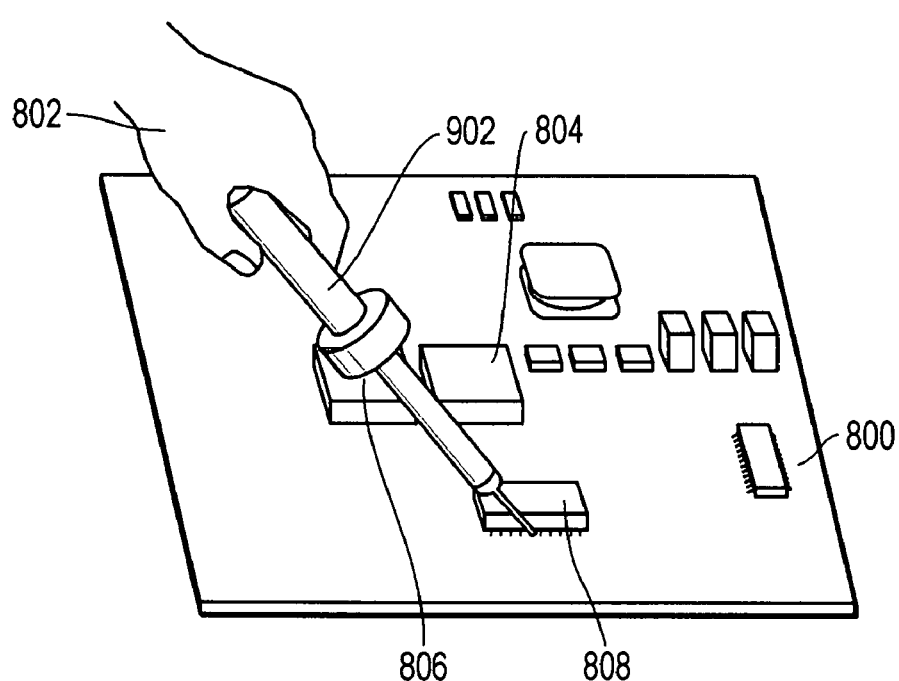
FIG. 9 illustrates a Direct Injection Probe Test according to one exemplary embodiment of the disclosed systems and methods.

FIG. 9 illustrates one exemplary embodiment, in which particular component pins of component 804 of printed circuit board 800 of notebook computer 406 are contacted by the probe tip of direct injection field probe 902 (e.g., Agilent 54006A Resistive Divider Probe) to inject an RF test signal into these particular circuit pins. For purposes of this example, it is assumed that only electronic component 804 was identified in the previous Localized Field Probe Test of FIG. 8 to be susceptible to electromagnetic radiation. Thus, in this embodiment, only circuit pins of component 804 are subjected to injection of RF test signal at one or more frequencies of concern identified in the previous Wand Test and Localized Field Probe Test. Such a Direct Injection Probe Test may be carried out to inject an RF signal into the indicated circuit pins at the indicated frequencies and power using an equipment setup procedure similar to that described above for wand testing. Although direct injection probe 902 is shown being held and contacted with circuit pins by human hand 802, it will be understood that automated contacting of a direct injection probe is also possible, e.g., using robotics or other mechanical contacting apparatus.

Figure 10:
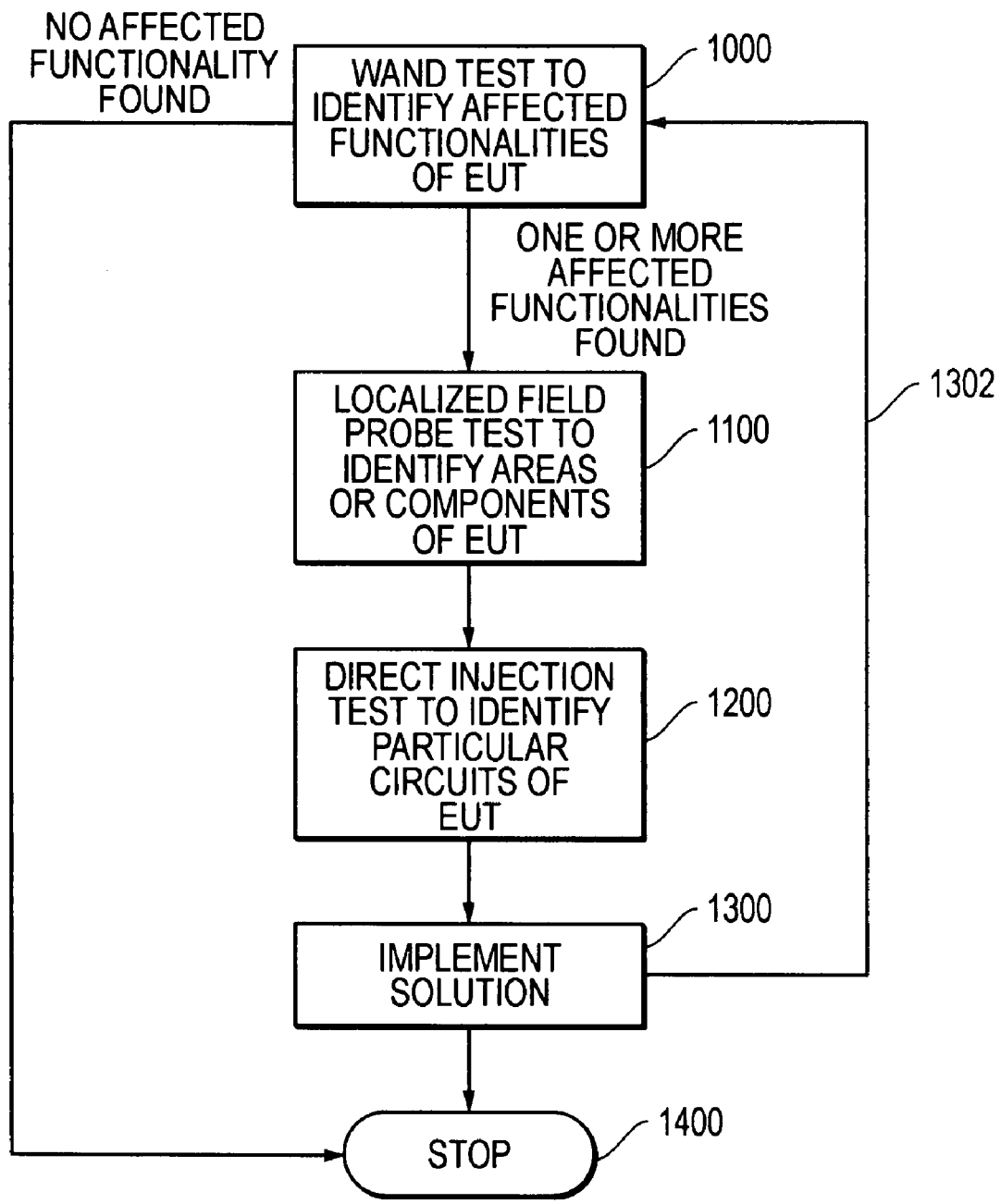
FIG. 10 illustrates testing methodology for evaluating electromagnetic interference and susceptibility of equipment under test according to one exemplary embodiment of the disclosed systems and methods.

FIG. 10 illustrates testing methodology for evaluating electromagnetic interference and susceptibility of an EUT such as an information handling system. Using the methodology of FIG. 10, a Wand Test is first performed in step 1000 to identify functionalities of the EUT that are affected by one or more frequencies of electromagnetic radiation. If no affected functionalities are found, the methodology may be terminated in step 1400. However, if one or more affected functionalities are found, a Localized Field Probe test may next be performed in step 1100 at the one or more frequencies identified in step 1000 to pinpoint particular areas or electronic components of the EUT that are affected by one or more of the previously identified frequencies of electromagnetic radiation. In step 1100, one or more frequencies may also be identified that affect each area or electronic component of the EUT. Next, a Direct Injection Probe Test may be performed in step 1200 on individual circuits of each area or component of the EUT that were identified in step 1100 as being affected by one or more frequencies of electromagnetic radiation. In step 1200, each individual circuit may only be tested by those frequencies identified in step 1100 as affecting the area or component of which the individual circuit is a part.

Once a particular circuit has been identified in step 1200 of FIG. 10, a solution may be optionally implemented to solve the interference problem in step 1300. For example, where GSM pulse modulation (~220 Hz) is identified as the cause of buzzing in a notebook computer audio system (due to interference signal induced in the amplifier of the audio system), shunt capacitors to ground may be placed inline with the speaker wires of the notebook computer to solve the problem. As shown by flow line 1302, a second wand test may be optionally performed after step 1300 to verify the solution prior to terminating the methodology in step 1400. It will be understood that the methodology of FIG. 10 is exemplary only, and that any one of steps 1000, 1100 and/or 1200 may be performed alone or in combination with one of the other steps at any one or more frequencies.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A method of evaluating electromagnetic interference with operation of an electronic device, comprising:
   producing an electromagnetic transmit signal;
   supplying said electromagnetic transmit signal to a test wand antenna to cause said test wand antenna to emit electromagnetic radiation;
   sweeping said test wand antenna in close proximity to one or more internal electronic components of said electronic device at the same time said test antenna is emitting said electromagnetic radiation;
   exercising said one or more electronic components of said electronic device while said electronic components are exposed to the near field of said electromagnetic radiation emitted by said test antenna; and
   monitoring the function of said one or more electronic components of said electronic device during said step of sweeping.

2. The method of claim 1, wherein said electromagnetic transmit signal comprises a radio frequency ("RF") transmit signal; and further comprising performing said method a plurality of times, a frequency of said RF transmit signal being different for each of said plurality of times.

3. The method of claim 1, wherein said electronic device comprises an information handling system, and wherein said electromagnetic transmit signal comprises a RF transmit signal.

4. The method of claim 3, wherein said method is performed to evaluate interference with said electronic device by electromagnetic radiation generated by a given type of wireless device; and wherein said electromagnetic transmit signal is selected to match the frequency, field level, and modulation characteristics of electromagnetic radiation generated by said given type of wireless device.

5. The method of claim 4, wherein said test wand antenna is tuned to a wavelength for the frequency band of said wireless device.

6. The method of claim 4, wherein said electronic device comprises an information handling system; and wherein said given type of wireless device comprises a GSM wireless card for said information handling system.

7. The method of claim 6, further comprising sweeping said test wand antenna at the same time said test antenna is emitting said electromagnetic radiation at a distance from said one or more internal electronic components of said information handling system that is substantially equivalent to the distance that said GSM wireless card is operatively disposed from said one or more internal electronic components during operation of said information handling system.

8. The method of claim 4, further comprising generating an electromagnetic signal from an electromagnetic signal source; adjusting said electromagnetic signal generated by said electromagnetic signal source to produce said electromagnetic transmit signal in a manner to match the frequency, field level, and modulation characteristics of electromagnetic radiation generated by said given type of wireless device; and supplying said electromagnetic transmit signal to said test wand antenna via a wire.

9. A method of evaluating electromagnetic interference with operation of an electronic device, comprising:
producing an electromagnetic transmit signal;
supplying said electromagnetic transmit signal to a localized field probe to cause said localized field probe to emit a localized field of electromagnetic radiation;
holding said localized field probe with a human hand in close proximity to at least one first electronic component of an electronic device at the same time said localized field probe is emitting said localized field of electromagnetic radiation such that said localized field of electromagnetic radiation exposes said first electronic component to a near field of the localized field without exposing an adjacent second component to the near field of electromagnetic radiation;
exercising said at least one electronic component of said electronic device while said at least one electronic component is exposed to the near field of said localized field of electromagnetic radiation emitted by said localized field probe; and
monitoring a functionality of said electronic device while said at least one electronic component is exposed to said near field of said localized field of electromagnetic radiation emitted by said localized field probe.

10. The method of claim 9, wherein said electronic device comprises an information handling system, and wherein said electromagnetic transmit signal comprises a radio frequency ("RF") transmit signal.

11. The method of claim 10, wherein said method is performed to evaluate interference with said electronic device by electromagnetic radiation generated by a given type of wireless device; and wherein said electromagnetic transmit signal is selected to match the frequency, field level, and modulation characteristics of electromagnetic radiation generated by said given type of wireless device.

12. The method of claim 11, wherein said electronic device comprises an information handling system; and wherein said given type of wireless device comprises a GSM wireless card for said information handling system.

13. The method of claim 11, further comprising generating an electromagnetic signal from an electromagnetic signal source; adjusting said electromagnetic signal generated by said electromagnetic signal source to produce said electromagnetic transmit signal in a manner to match the frequency, field level, and modulation characteristics of electromagnetic radiation generated by said given type of wireless device; and supplying said electromagnetic transmit signal to said localized field probe via a wire.

14. The method of claim 9, wherein said electronic device comprises multiple components; and wherein said method further comprises performing component by component probing of individual components of said multiple components without affecting adjacent components by holding said localized field probe with a human hand in close proximity to each of said individual components of said electronic device at the same time said localized field probe is emitting said localized field of electromagnetic radiation such that said localized field of electromagnetic radiation exposes each of said individual electronic components to a near field of the localized field without exposing said adjacent components to the near field of electromagnetic radiation.

15. A method of evaluating electromagnetic interference with operation of an electronic device, comprising:
producing an electromagnetic transmit signal;
supplying said electromagnetic transmit signal to a direct injection field probe;
contacting said direct injection field probe with at least one circuit of said electronic device to directly inject said electromagnetic transmit signal into said at least one circuit of said electronic device;
exercising said at least one circuit of said electronic device while directly injecting said electromagnetic transmit signal into said at least one circuit of said electronic device; and
monitoring a functionality of said electronic device while directly injecting said electromagnetic transmit signal into said at least one circuit of said electronic device;
wherein said method is performed to evaluate interference with said electronic device by electromagnetic radiation generated by a given type of wireless device;
wherein said electromagnetic transmit signal is selected to match the frequency, field level, and modulation characteristics of electromagnetic radiation generated by said given type of wireless device; and
wherein said method further comprises generating an electromagnetic signal from an electromagnetic signal source; adjusting said electromagnetic signal generated by said electromagnetic signal source to produce said electromagnetic transmit signal in a manner to match the frequency, field level, and modulation characteristics of electromagnetic radiation generated by said given type of wireless device; and supplying said electromagnetic transmit signal to said direct injection field probe via a wire.

16. The method of claim 15, wherein said electronic device comprises an information handling system, and wherein said electromagnetic transmit signal comprises a radio frequency ("RF") transmit signal.

17. The method of claim 15, wherein said electronic device comprises an information handling system; and wherein said given type of wireless device comprises a GSM wireless card for said information handling system.

18. An electromagnetic interference test system, comprising:
an electromagnetic signal source; and
a hand held test antenna, said hand held test antenna comprising at least one of a test wand antenna, a localized field probe, or a direct injection field probe;
wherein said electromagnetic signal source is coupled to said hand held test antenna via a wire; and wherein said electromagnetic signal source is configured to supply an electromagnetic transmit signal to said localized field probe via said wire;
wherein said electromagnetic transmit signal comprises a radio frequency ("RF") transmit signal; and wherein said electromagnetic transmit signal is selected to match the frequency, field level, and modulation characteristics of electromagnetic radiation generated by a given type of wireless device; and
wherein said electromagnetic signal source is configured to adjust an electromagnetic signal to produce said electromagnetic transmit signal in a manner to match the frequency, field level, and modulation characteristics of electromagnetic radiation generated by said given type of wireless device; and to supply said electromagnetic transmit signal to said direct injection field probe via a wire.

19. The system of claim 18, wherein said given type of wireless device comprises a GSM wireless card for an information handling system.

20. The method of evaluating electromagnetic interference with operation of an electronic device, comprising:
producing an electromagnetic transmit signal;
supplying said electromagnetic transmit signal to a test wand antenna to cause said test wand antenna to emit electromagnetic radiation;
sweeping said test wand antenna in close proximity to one or more internal electronic components of said electronic device at the same time said test antenna is emitting said electromagnetic radiation;
exercising said one or more electronic components of said electronic device while said electronic components are exposed to the near field of said electromagnetic radiation emitted by said test antenna; and
monitoring the function of said one or more electronic components of said electronic device during said step of sweeping;
wherein said electronic device comprises an information handling system, and wherein said electromagnetic transmit signal comprises a RF transmit signal;
wherein said method is performed to evaluate interference with said electronic device by electromagnetic radiation generated by a given type of wireless device; and wherein said electromagnetic transmit signal is selected to match the frequency, field level, and modulation characteristics of electromagnetic radiation generated by said given type of wireless device;
wherein said electronic device comprises an information handling system; and wherein said given type of wireless device comprises a GSM wireless card for said information handling system; and
wherein said method further comprises sweeping said test wand antenna at the same time said test antenna is emitting said electromagnetic radiation at a distance from said one or more internal electronic components of said information handling system that is substantially equivalent to the distance that said GSM wireless card is operatively disposed from said one or more internal electronic components during operation of said information handling system.

21. The method of evaluating electromagnetic interference with operation of an electronic device, comprising:
producing an electromagnetic transmit signal;
supplying said electromagnetic transmit signal to a test wand antenna to cause said test wand antenna to emit electromagnetic radiation;
sweeping said test wand antenna in close proximity to one or more internal electronic components of said electronic device at the same time said test antenna is emitting said electromagnetic radiation;
exercising said one or more electronic components of said electronic device while said electronic components are exposed to the near field of said electromagnetic radiation emitted by said test antenna; and
monitoring the function of said one or more electronic components of said electronic device during said step of sweeping;
wherein said method is performed to evaluate interference with said electronic device by electromagnetic radiation generated by a given type of wireless device; and wherein said electromagnetic transmit signal is selected to match the frequency, field level, and modulation characteristics of electromagnetic radiation generated by said given type of wireless device; and
wherein said method further comprises generating an electromagnetic signal from an electromagnetic signal source; adjusting said electromagnetic signal generated by said electromagnetic signal source to produce said electromagnetic transmit signal in a manner to match the frequency, field level, and modulation characteristics of electromagnetic radiation generated by said given type of wireless device; and supplying said electromagnetic transmit signal to said test wand antenna via a wire.

22. A method of evaluating electromagnetic interference with operation of an electronic device, comprising:
producing an electromagnetic transmit signal;
supplying said electromagnetic transmit signal to a localized field probe to cause said localized field probe to emit a localized field of electromagnetic radiation;
holding said localized field probe with a human hand in close proximity to at least one electronic component of an electronic device at the same time said localized field probe is emitting said localized field of electromagnetic radiation;
exercising said at least one electronic component of said electronic device while said at least one electronic component is exposed to the near field of said localized field of electromagnetic radiation emitted by said localized field probe; and
monitoring a functionality of said electronic device while said at least one electronic component is exposed to said near field of said localized field of electromagnetic radiation emitted by said localized field probe;
wherein said method is performed to evaluate interference with said electronic device by electromagnetic radiation generated by a given type of wireless device; and wherein said electromagnetic transmit signal is selected to match the frequency, field level, and modulation characteristics of electromagnetic radiation generated by said given type of wireless device; and
wherein said method further comprises generating an electromagnetic signal from an electromagnetic signal source; adjusting said electromagnetic signal generated by said electromagnetic signal source to produce said electromagnetic transmit signal in a manner to match the frequency, field level, and modulation characteristics of electromagnetic radiation generated by said given type of wireless device; and supplying said electromagnetic transmit signal to said localized field probe via a wire.

* * * * *